(12) United States Patent
Bhavsar et al.

(10) Patent No.: US 6,260,166 B1
(45) Date of Patent: *Jul. 10, 2001

(54) OBSERVABILITY REGISTER ARCHITECTURE FOR EFFICIENT PRODUCTION TEST AND DEBUG

(75) Inventors: Dilip Kantilal Bhavsar, Shrewsbury; Michael Karl Gowan, Framingham, both of MA (US)

(73) Assignee: Compaq Computer Corporation, Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,306

(22) Filed: Jun. 1, 1998

(51) Int. Cl.[7] .................................................. G01R 31/28
(52) U.S. Cl. ................................................................ 714/727
(58) Field of Search ................................... 714/724, 726, 714/727, 729; 710/72, 20, 62

(56) References Cited

U.S. PATENT DOCUMENTS

| | | | |
|---|---|---|---|
| 3,961,254 | * 6/1976 | Cavaliere et al. | 714/730 |
| 5,253,255 | 10/1993 | Carbine | 714/734 |
| 5,423,050 | * 6/1995 | Taylor et al. | 714/31 |
| 5,444,404 | * 8/1995 | Ebzery | 327/185 |
| 5,535,331 | * 7/1996 | Swoboda et al. | 714/45 |
| 5,561,614 | * 10/1996 | Revilla et al. | 702/120 |
| 5,627,842 | * 5/1997 | Brown et al. | 714/727 |
| 5,717,700 | * 2/1998 | Crouch et al. | 717/726 |
| 5,956,336 | * 9/1999 | Loschke et al. | 370/392 |
| 6,070,259 | * 5/2000 | Roisen et al. | 714/726 |
| 6,115,763 | * 9/2000 | Douskey et al. | 710/72 |

OTHER PUBLICATIONS

Bhavsar et al (Testability Strategy of The Alpha AXP 21164 Microprocessor. IEEE, Oct. 1994).*

Burgess, et al. (The Boundary scan: A Standard Worth Pursuing in the VLSI Design Environment, IEEE, 1995).*

Bhavsar, D.K. et al., "Self–Testing by Polynomial Division," reprinted from Digest of Papers, 1981 International Test Conference, Oct. 1981, Philadelphia, Pa., IEEE Catalog No. 81CH1693–1 (9 pp.).

Bhavsar, D., "A Method for Synchronizing IEEE 1149. 1 Test Access Port for Chip Level Testability Access," Eleventh VLSI Design Conf., Jan., 1998 (pp. 289–292).

Carbine, A. and D. Feltham, "Pentium–Pro® Microprocessor Design for Test and Debug," Int'l Test Conf., Nov. 1997 (10 pp.).

Bhavsar, D.K. et al., "Testability Strategy of the Alpha AXP 21164 Microprocessor," IEEE International Test Conference 1994 pp. 50–59.

* cited by examiner

Primary Examiner—Albert Decady
Assistant Examiner—Guy Lamarre
(74) Attorney, Agent, or Firm—Hamilton, Brook, Smith & Reynolds, P.C.

(57) ABSTRACT

An observability register used in the testing of integrated circuits includes a configurable data path for allowing data to pass directly from the input port to the output port. Such a configuration is referred to as a bypass mode. The invention allows selected ones of a serial chain of observability registers to be configured in the bypass mode such that data from the remaining observability registers can more easily be analyzed.

16 Claims, 9 Drawing Sheets

OBSERVABILITY REGISTER ARCHITECTURE FOR EFFICIENT PRODUCTION TEST AND DEBUG

BACKGROUND OF THE INVENTION

This invention relates generally to computer systems and more specifically to testing of very large integrated circuits (ICs) which cannot be easily tested from associated external electrical contact pins or wafer probes.

As it is known in the art, ICs can include a number of circuits typically containing many transistors and other electronic devices interconnected by conductive paths arranged in different circuit configurations. Those circuits can be coupled to electrical devices external to the IC via electrical contact pins that carry input and output signals to and from the device.

A portion of the above mentioned ICs are located "functionally close" to one of the electrical contact pins. After an IC is manufactured, it is tested for defects by monitoring the manner in which those contact pins respond to patterns of electrical signals, referred to as "test vectors", that are input to the IC. Those test vectors cause the circuits to generate deterministic output values which are output on the associated contact pins. Those responses are compared with "known good values", i.e. accurate expected values, to determine if the circuit is operating correctly. Such a test methodology becomes increasingly ineffective as ICs become larger and more circuit portions are placed functionally further away from the electrical contact pins.

A majority of the circuits that comprise an IC are typically located functionally distant from a contact pin and therefore cannot be tested effectively in the manner described above. The term "functionally distant" means that any defects present in that circuit cannot easily be determined by monitoring the associated external contact pins. For example a circuit which is functionally distant from a given contact pin may be coupled to an associated contact pin through other circuits, and may induce the same electrical signal on that contact pin whether or not it is functioning properly. Accordingly, it is essential to employ other suitable methods to test the functioning of those individual circuits.

Each time an IC is tested, a series of test vectors are imposed on its contact pins. These test vectors are typically designed to exercise a particular function involving a selected group of circuits in the IC device under test, referred to as the "DUT". By imposing a number of test vectors on the DUT, every significant function of the device can be exercised to determine whether it is operating properly.

Typically, dedicated testing circuits are designed into the IC for monitoring these functionally distant circuits during such an IC test. Those testing circuits are typically Linear Feedback Shift Registers (LFSRs) which sample an electrical node or group of electrical nodes of a pre-selected circuit at a series of selected times during the test. Those samples are compressed into a compact representation within the LFSR. The output of the compression operation is referred to as a "segment signature". The segment signature is serially output to an external contact pin such that it can be compared with a known good segment signature value by the IC tester. Alternatively, the samples can be stored in an uncompressed format which is output to a contact pin for cycle-by-cycle analysis, as will be described below.

Typically, many LFSRs are designed into an IC since a majority of circuits to be tested in an IC are functionally distant from a contact pin. The LFSRs are often connected in series such that the serial output of one LFSR is connected to the serial input of the next LFSR. The serial input of the first LFSR in the series and the serial output of last LFSR in the series are connected to external contact pins. When all of the LFSRs in the series have finished sampling data from the circuits to which they are coupled, they are commanded to serially shift the generated segment signatures towards the contact pin. Because the LFSRs are connected serially, a segment signature that is shifted out of a first LFSR is shifted into a second LFSR to which it is connected. The segment signature values are shifted through the serial chain of LFSRs until the entire segment signature generated by the first LFSR is shifted out of the last LFSR, i.e. onto the contact pin and into the IC tester. The segment signatures that are shifted onto the external contact pin are collectively referred to as the "signature" of the test. If the signature is not exactly the same as to a known good signature, the test fails and the circuit contains a defect that has rendered the device inoperable or merely partially operable (i.e., performing below an acceptability threshold).

When a failure is detected in a device under test (referred to as a DUT), the cause of that failure must be identified for the purpose of determining if there is a problem with the manufacturing process or whether there is an error in the design of the circuit. In either case, there are typically three procedures that are used in the industry to identify the cause of a failing test. Each of the three procedures requires significant amounts of testing time to isolate the source of the failure.

The first procedure involves operating the LFSRs in a "snap-shot" mode. In such a snap-shot mode, the LFSRs are configured to capture data during only a single specified "clock-cycle" of the test. The test vectors are imposed upon the DUT at a rate of one test vector per clock cycle. Because an IC test may typically include several million clock-cycles, such a testing methodology demands running the entire test several million times and, each time, capturing data during a different clock-cycle. The result of the test exhaustively depicts the value of the sampled signals at each cycle of the test. The error condition is subsequently determined by identifying the clock-cycle in which the sampled values differ from the known good values. This method requires a significant investment of time.

The second testing methodology used in the industry includes a "binary search." Such a methodology divides the test vectors into two groups, each containing about half of the test vectors. A known good signature is determined for the first group of test vectors by simulating the operation of the circuit using one of many simulation methods typically used in the industry. Subsequently, the first group of test vectors is imposed on the DUT and the signature generated by the LFSRs is compared with the known good signature. If the comparison indicates that the two signatures are not identical, then the failing condition is identified as being caused by the first group of test vectors. If, on the other hand, the comparison indicates that the two signatures are identical, the failing condition is identified as being caused by the second group of test vectors. The group of test vectors in which the failing condition is found to arise is further divided into two groups and the process repeated. The test vector groups continue to be divided, and the test re-run, until the exact location of the failure is identified.

The third methodology uses a variation of the binary search method of the second test methodology to isolate the cause of the test failure to within a small predetermined number of test vectors that can be analyzed in a reasonable amount of time. The binary search method is used to identify the general location of the test vector causing the failure. The test is modified such that it will pause when it reaches the test vector area containing the failure. The LFSRs are subsequently placed into the snap-shot mode of the first test methodology and the test is restarted from the beginning. The snap shot methodology is executed from the point at which the test is paused, requiring the remaining test vectors to be repeatedly imposed upon the DUT until each cycle of the identified test vector area have been sampled.

Each of the three testing methodologies described above involve substantial pattern development effort, testing time and sampled data comparison time. Such efforts are expensive, time consuming, complex and require repeated iterations of the same test vectors.

SUMMARY OF THE INVENTION

The present invention resides in a method and apparatus for isolating failing circuits within an IC device using a linear feedback shift register (LFSR) capable of selective operation in either a bypass or normal mode. After a specific circuit fails a test, the LFSRs associated with that circuit are placed in normal operating mode. The remainder of the LFSRs are placed in bypass mode so as to functionally isolate that circuit for further testing and analysis of the cause of the failure.

More specifically, the present invention involves allowing each LFSR in a serial chain of LFSRs to operate in either a "normal operation" mode or a "bypass" mode. When an LFSR operates in the bypass mode it forwards data, placed on its input port by an IC tester or by another LFSR, to the next LFSR in the serial chain. Because the IC includes control logic for individually placing each LFSR into either bypass mode or normal operation mode, specific LFSRs in the serial chain can be placed in normal operation mode while the remainder are placed in bypass mode. Therefore, when sample data from a specific LFSR disagrees with a known good value, i.e. when the associated circuit is failing that test, every other LFSR in the serial chain is placed into bypass mode. The LFSR that is associated with the failing data is then placed into a snapshot mode to sample the IC on a cycle-by-cycle basis. Those LFSRs output the values sampled during a particular cycle and then the test is re-run. The data output from that LFSR passes through or "bypasses" each of the other LFSRs. That data is output on the contact pin connected to the last LFSR in the serial chain. Isolating the cause of the failure is reduced to a fixed problem because it is known that the failing condition is contained within the small number of samples taken by that LFSR. The snapshot mode is used only for that small number of samples. Accordingly, testing time and complexity is reduced since the data that is analyzed is closely related to the failing condition and is guaranteed to be within a small, fixed number of samples defined by the size of the LFSR.

BRIEF DESCRIPTION OF THE DRAWINGS

The foregoing features of this invention, as well as the invention itself, may be more fully understood from the following detailed description when read in conjunction with the accompanying drawings, in which.

DESCRIPTION OF A PREFERRED EMBODIMENT

Figure 1:
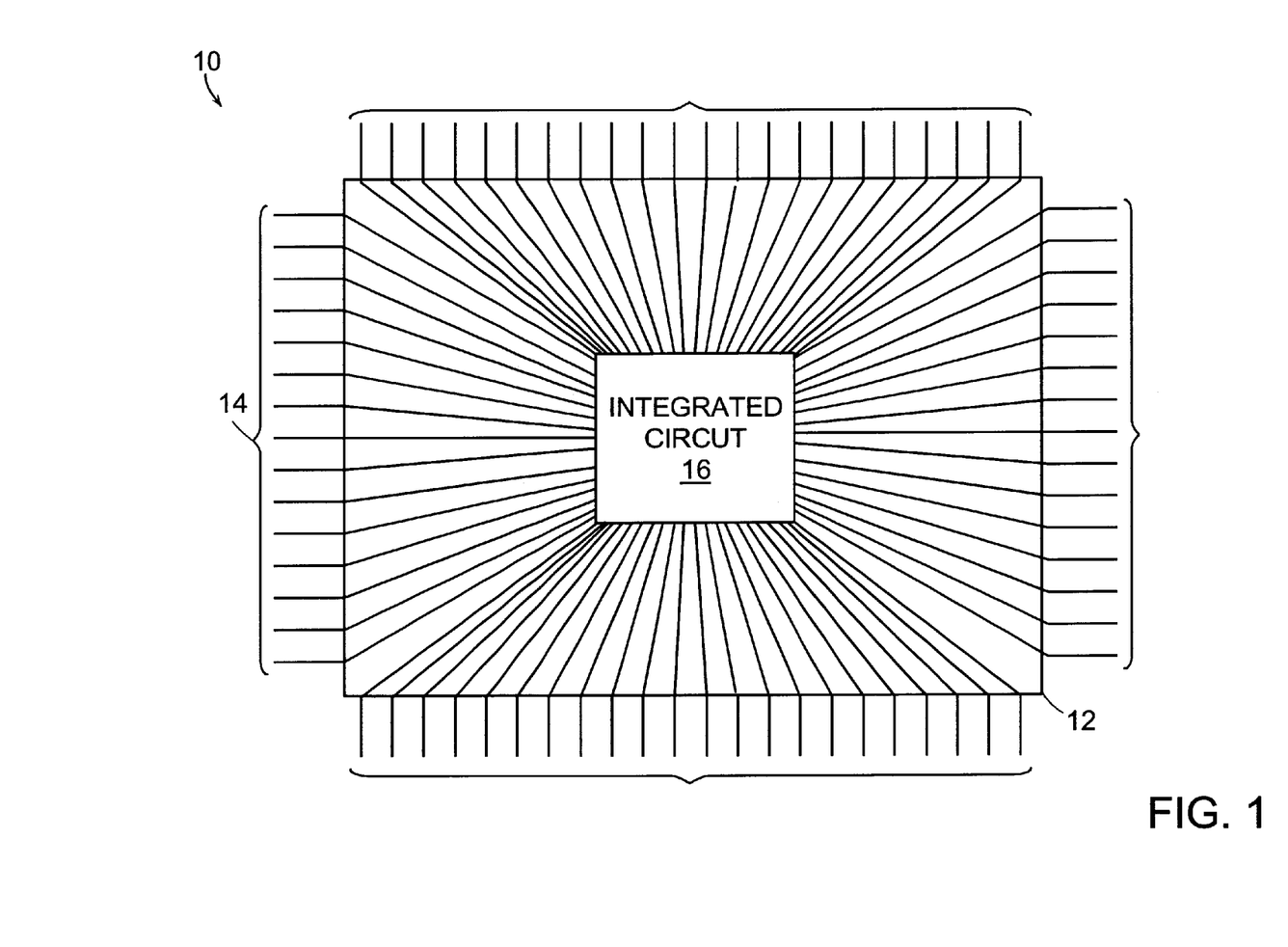
FIG. 1 depicts an integrated circuit device containing the embodied invention.

Referring to FIG. 1, an integrated circuit device 10 is shown to include an integrated circuit (IC) coupled to an IC package 12 and a plurality of contact pins 14. The IC package 12 is typically constructed of either plastic or ceramic in which the IC 16 is encased. The IC 16 has input and output ports referred to as "pads" (not shown) for inputting and outputting signals to the contact pins 14. The contact pins are connected to the pads by wire leads that carry all electrical signals conveyed to and from the IC. When the IC is tested, the leads carry all electrical signals supplied by an IC tester that are required for normal operation. Also input to the IC during such an IC test are electrical signals associated with "test vector" that force the IC to perform a specified series of operations.

I. Testing of ICs

Figure 2:
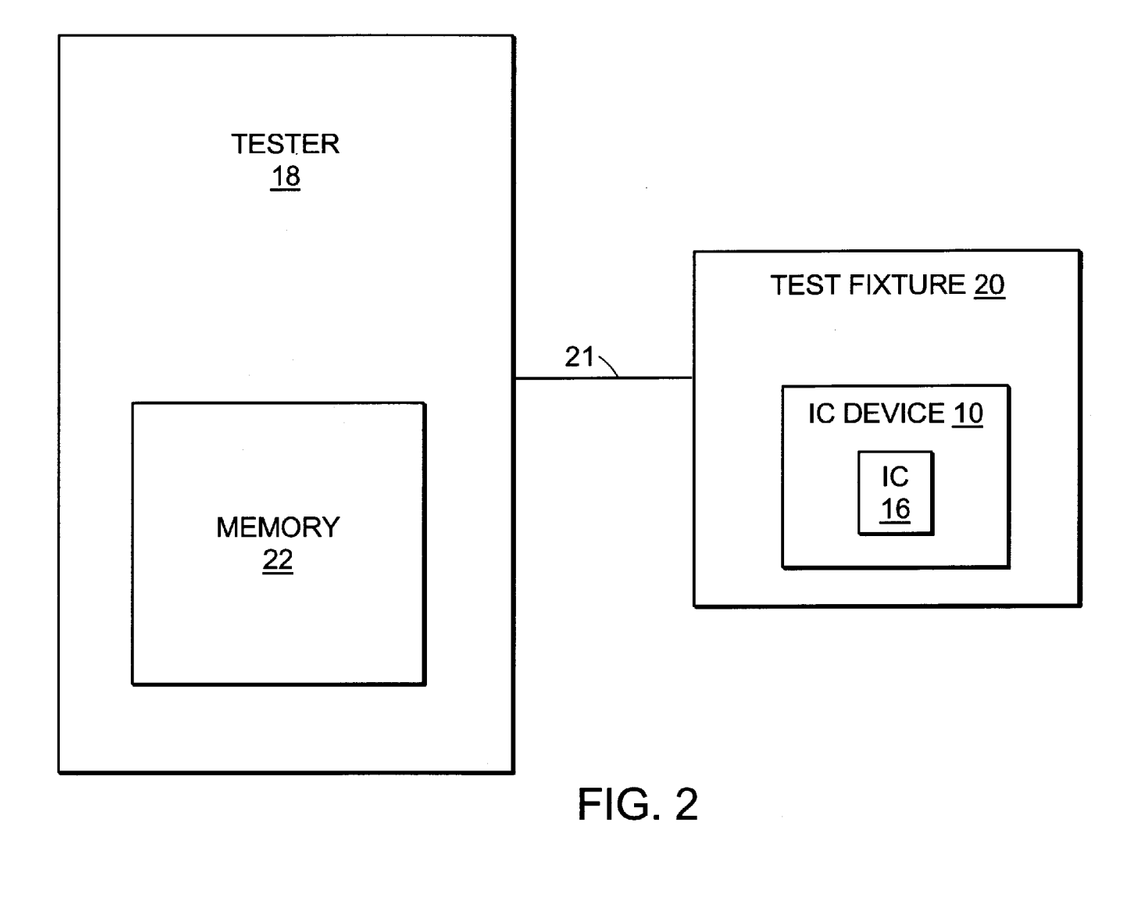
FIG. 2 depicts an integrated circuit device including the integrated circuit of FIG. 1 coupled to an integrated circuit tester.

Referring now to FIG. 2, an integrated circuit device 10 is shown coupled to an integrated circuit tester 18 via a test fixture 20 and a bus 21. The IC tester 18 includes a memory 22 for storing test vectors that are translated into corresponding electrical signals which are provided to the integrated circuit device 10. The electrical signals that correspond to the test vectors simulate a particular operating environment to which the IC is expected to respond in a specified manner, i.e. by generating a predetermined sequence of output signals.

Before a series of test vectors are imposed on the IC 16, a series of initialization or reset vectors are imposed on the device. The initialization vectors generate a series of electrical signals which place the integrated circuit 10 into a known state. For example, the reset vectors may cause a predetermined electrical signal to be imposed on a reset pin of the integrated circuit device 10 for a specified period of time, or may impose a sequence of commands to the IC 16 that store values in specified memory locations. Each IC 16 will have a unique procedure for initialization, however each procedure results in the IC 16 being configured in a selected operating mode to facilitate an IC test. The reset vectors also configure the Observability Registers 24 (OBSRs). The OBSRs are based upon Linear Feedback Shift Registers (LFSRs) but, in the present embodiment, include further functionality as will be described below.

II. Observability Registers

Figure 3:
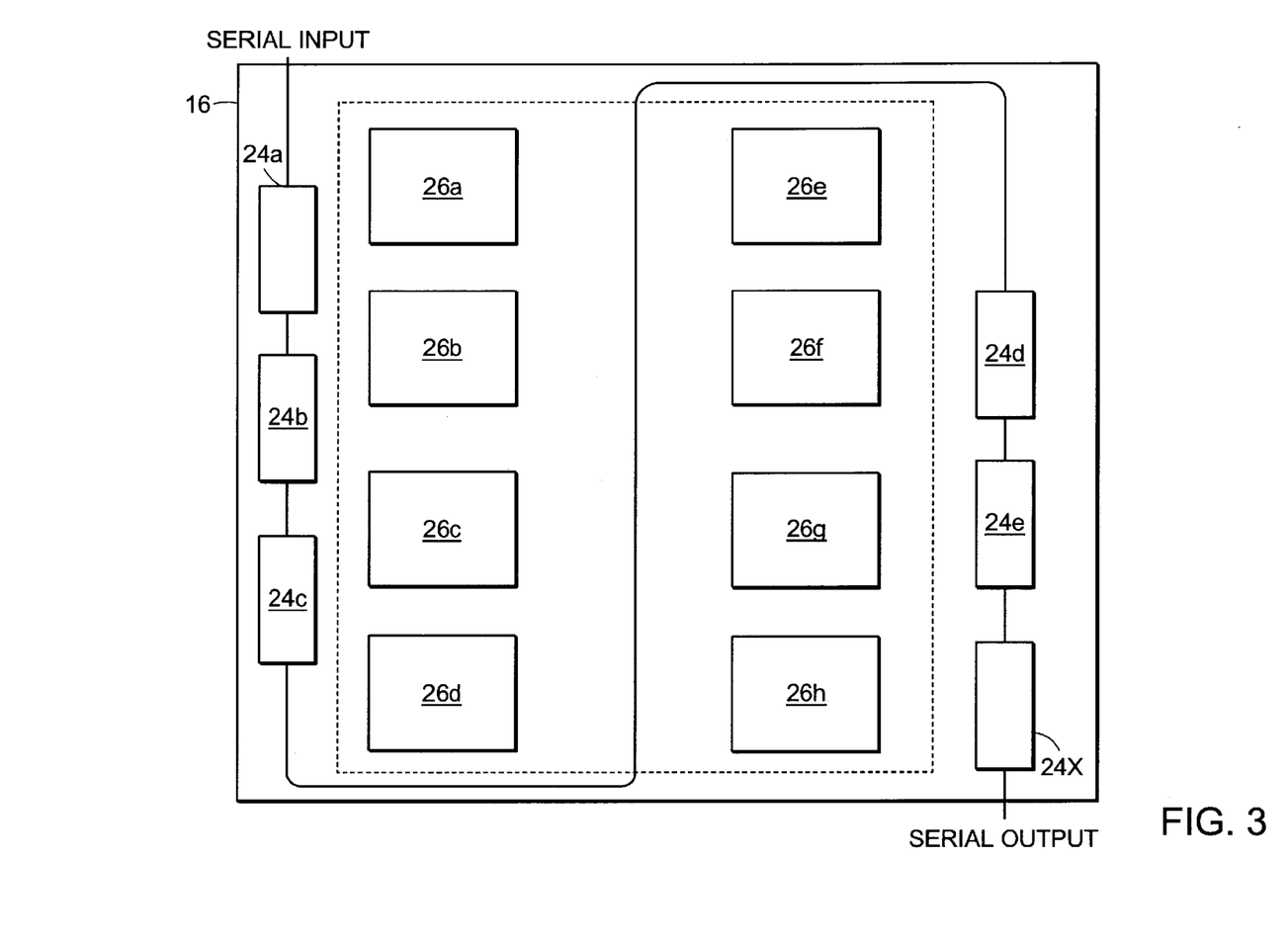
FIG. 3 depicts the integrated circuit of FIG. 1 including serially connected Linear Feedback Shift Registers (LFSRs)

Referring now to FIG. 3, the IC 16 is shown to include several circuit portions 26a–26h, and several serially connected OBSRs 24a–24x. Each OBSR 24 includes one or more "circuit probes," referred to as "probes." Each probe is connected to a point in one of the given circuit portions 26 for sampling the voltage level at that point at specified time intervals during an IC test. As data is sampled, it is combined with data that is already stored in the OBSR. The effect of such a technique is to recursively compress sample data such that it requires a significantly smaller amount of memory storage space in the tester and which will take a smaller amount of time to convey to the tester after a test is completed. Alternatively, the sampled data can be stored in an uncompressed format.

Figure 4:
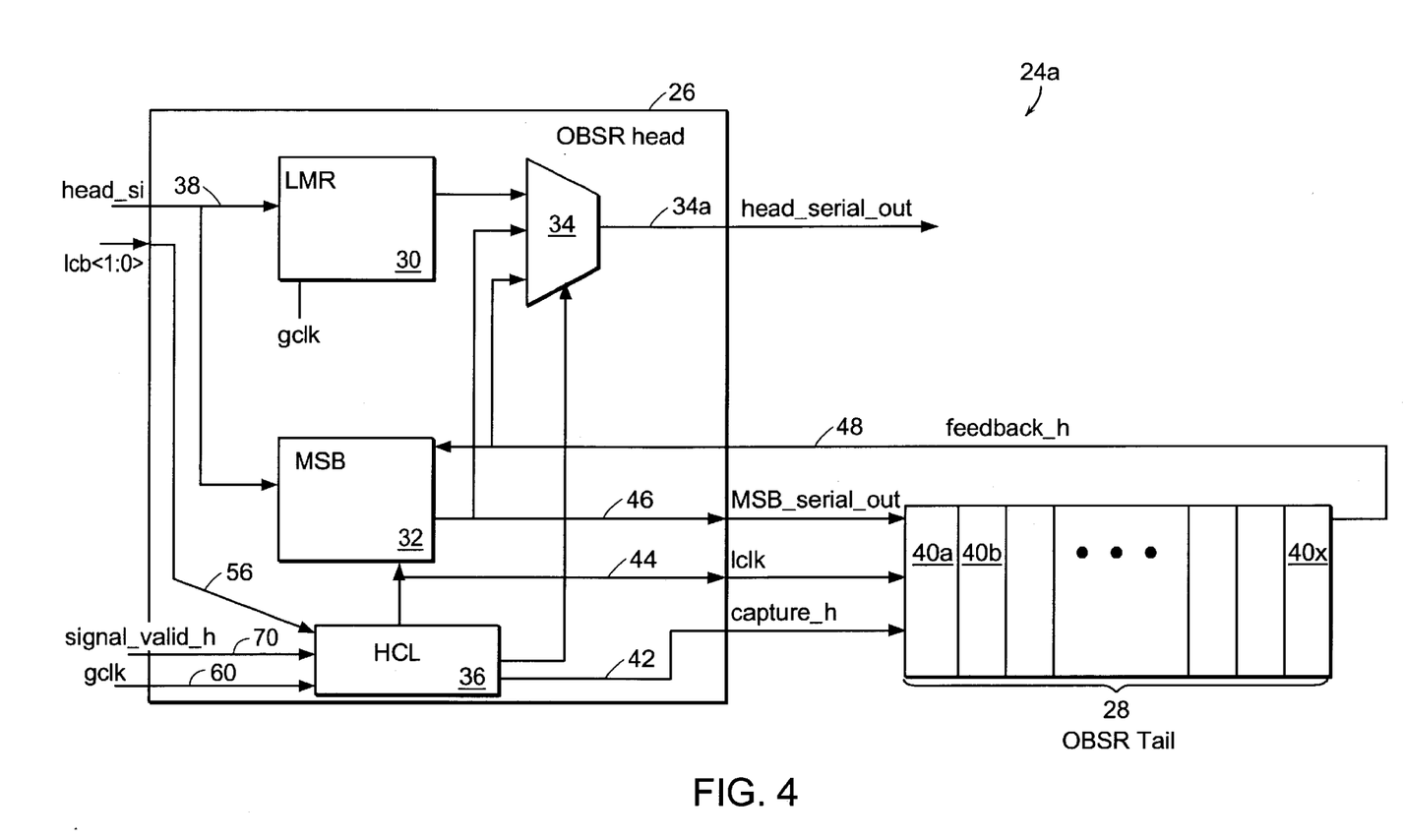
FIG. 4 depicts a representative LFSR of FIG. 3 including an LFSR head section and an LFSR tail section.

Referring now to FIG. 4, a representative OBSR 24a is shown to include two connected sections referred to as the OBSR head 26 and the OBSR tail 28. The OBSR head 26 includes the OBSR mode register (LMR) 30, most significant bit shift logic (MSB) 32, the output multiplexer 34, and the head control logic (HCL) 36. The OBSR head 26 receives as input a data bus referred to as the head_si_h signal 38, from the tester 18. The head_si_h signal 38 carries data from the previous OBSR 24a in the serial chain, to the LMR 30 and to an input port of the MSB 32. The output ports of the LMR 30 and the MSB 32 are coupled to separate input ports of the output multiplexer 34 along with a feedback signal 48 from the OBSR tail 28. The output port 34a of the output multiplexer 34, which is also referred to as the output port of the OBSR 24b (see FIG. 3) or the head_serial_out signal 34a, is coupled to the head_serial_in signal 38 associated with the next OBSR 24c in the serial chain.

The OBSR tail 28 contains logic that samples a node (or nodes) of the IC 16 during an IC test. The OBSR tail 28 includes a plurality of OBSR sampling cells 40 which are connected in a serial chain fashion, i.e. the serial output of a first OBSR sampling cell 40a is coupled to the serial input of the next OBSR sampling cell 40b in the serial chain and so on. The first OBSR sampling cell 40a in the serial chain has its serial input port coupled to the MSB_serial_out signal 46, output from the MSB 32. The serial output signal, feedback_h 68, of the last OBSR sampling cell 40x in the serial chain is fed back into the OBSR head 26 and to one or more selected cells in the tail. More specifically, signal feedback_h 68 is fed back into an input port of the MSB 32 and into an input of the output multiplexer 34. Each OBSR sampling cell 40 is connected to a signal referrred to as capture_h 42 and to a clocking signal referred to as "Lclk" 44 which are output from the OBSR head control logic 36. When the capture_h signal 42 is asserted, the OBSR sampling cell 40 samples the voltage or logical value of the connected IC node upon each assertion of the Lclk signal 44.

Figure 5:
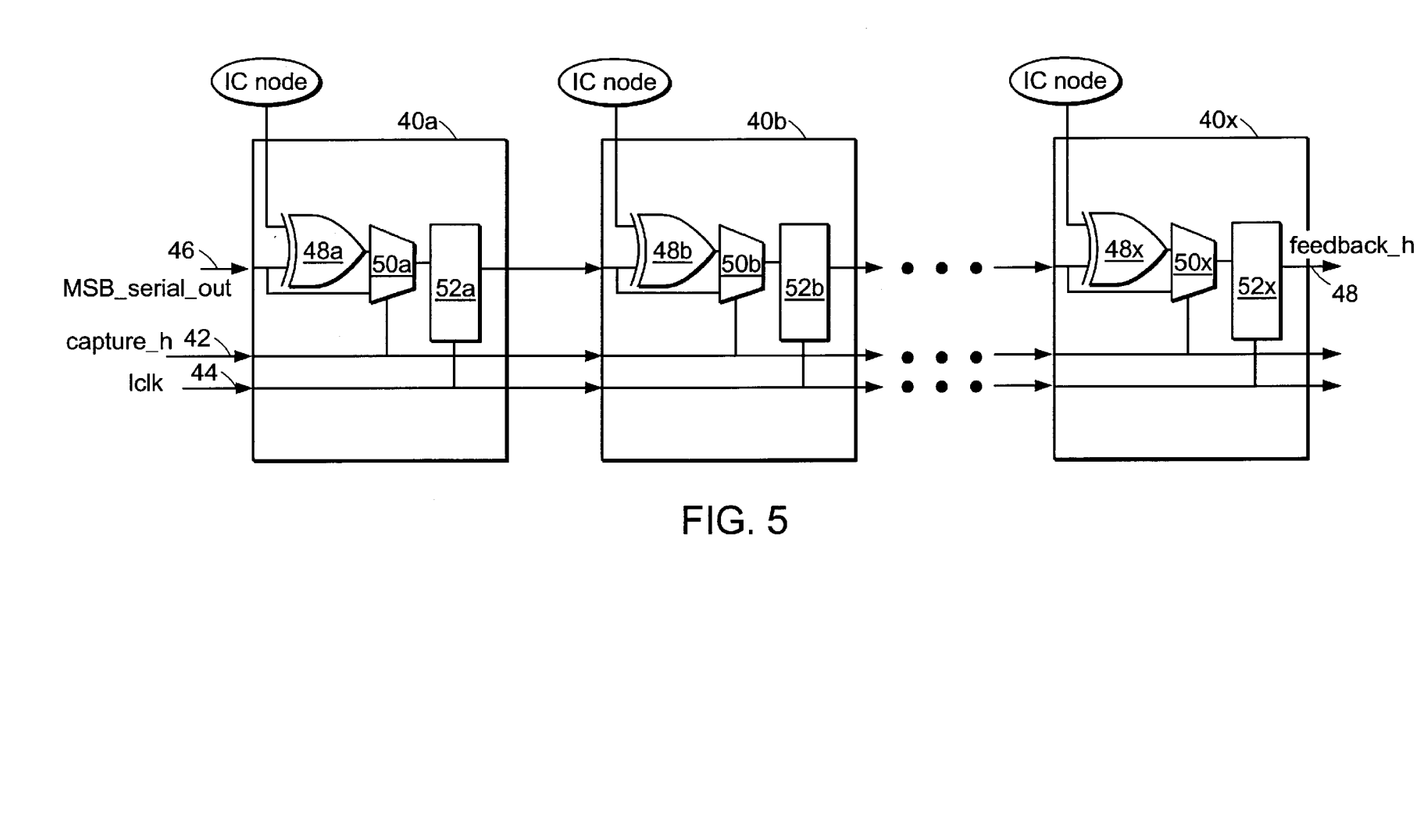
FIG. 5 depicts a schematic diagram of a representative LFSR tail section.

Referring now to FIG. 5, a more detailed representation of the OBSR tail 28 is shown to include several representative OBSR sampling cells 40a, 40b, 40x. Each of the OBSR sampling cells is shown to include an exclusive-or gate 48, a multiplexer 50 and a flip-flop 52. The exclusive-or gate 48 has a first input port coupled either to the IC node to be sampled or to the feedback_h signal 68 (not shown). The first input port of the exclusive-or gate 68 can be coupled to the feedback_h signal 48 in order to compress the sampled data as will be described below. The input of each OBSR sampling cell is coupled to a second input port of the exclusive-or gate 48 and to a first input port of the multiplexer 50. The capture_h signal 42 is coupled to the selection input of multiplexer 50 such that the multiplexer 50 will output either a representation of the sampled value at the IC node, or will output data conveyed from a previous OBSR sampling cell. When the multiplexer 50 outputs data, it is input to the flip-flop 52. Flip-flop 52 samples that output data on every asserting edge of the clocking signal Lclk 44.

OBSR sampling cells 40a, 40b, and 40x are shown connected in a serial chain manner. Wherein OBSR sampling cell 40a forms the beginning of the chain and OBSR sampling cell 40x forms the end of the chain. The serial input of OBSR sampling cell 40a receives signal MSB_serial_out 46, output from MSB 32 (see FIG. 4). This signal is used to initialize the serial chain of OBSR sampling cells and to push sampled data out of the sampling cells, as will be described below. The serial output of OBSR sampling cell 40a is coupled to the serial input of OBSR sampling cell 40b such that data can be serially transmitted through the serial chain. Also, signals capture_h 42 and Lclk 44 are input to OBSR sampling cell 40a. Signal capture_h 42 is coupled to multiplexer 50a, and signal Lclk 44 is coupled to flip flop 52a. Both signals are coupled to the next OBSR sampling cell, e.g. 40b. In this manner, each OBSR sampling cell receives those signals. The output of the last OBSR sampling cell 40x, in the serial chain, generates the feedback_h signal 68. This is passed back into MSB 32 and into one or more selected sampling cells. Now that the schematic diagrams of a representative OBSR have been specified, the functional operation of that OBSR will be described in detail.

III. Modes of Operation

Figure 6:
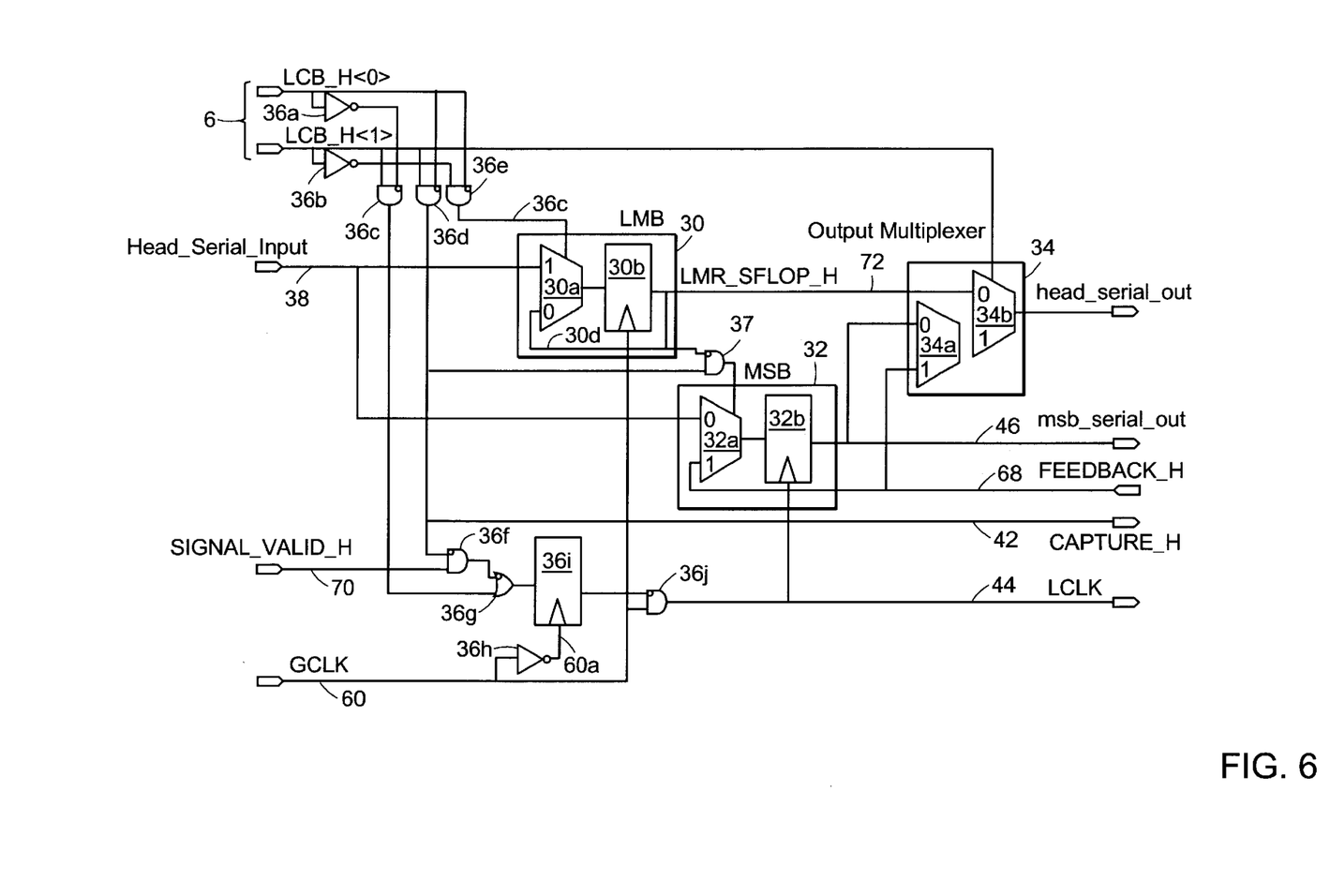
FIG. 6 depicts a schematic diagram of a representative LFSR head section.

Referring now to FIG. 6, a schematic representation of the OBSR head 26 of the OBSR 24 is shown. The OBSR 24 can be operated in several operating modes and several functional modes, each of which will now be described with respect to the detailed circuit schematics of the OBSR head 26 (FIG. 6) and OBSR tail 28 (FIG. 5).

The OBSR 24 is placed into one of two "operating" modes by storing a command value in a memory storage location 30b of the LMR 30. These two operating modes are referred to as the "SegmentBypass" mode and the "SegmentNormal" mode. When that memory storage location is cleared, the OBSR 24a is placed into SegmentBypass mode. When the OBSR 24 is placed in the SegmentBypass mode, a data path is enabled that allows data to pass from the input port of the OBSR head 26 directly to the output multiplexer 34 via the MSB 32. Alternatively, when the memory storage location 30b in the LMR 30 is set, the OBSR 24a is placed into SegmentNormal mode. When the OBSR 24 is placed in the SegmentNormal mode, a data path is enabled that allows data to pass from the output port of the OBSR tail 28 through the MSB 32 and also through the output multiplexer 34.

a. Segment Normal Mode

Referring to FIG. 6, the OBSR 24a is placed into the SegmentNormal mode when a logical '1' value is stored in the LMR 30. More specifically, that logical '1' value is stored in the flip-flop 30b of the LMR 30. The flip-flop 30b outputs the logical '1' value on the LMR_sflop_h signal 72 which is coupled to the selection input of multiplexer 32a via And gate 37. Because one input of And gate 37 is a logical '1' it therefore outputs the same value as And gate 36d. Depending upon the output of And gate 36d, a data path is selected such that either the feedback_h signal 68 or the head_serial_input signal 38 (depending on the functional mode selected, as will be described below) is passed to flip-flop 32b. The output of flip-flop 32b is input to the OBSR tail 28 via signal MSB_serial_out 46. The serial output of OBSR tail 28 is input to multiplexer 34a of the output multiplexer 34 via the feedback_h signal 68. That data is passed through multiplexer 34a and through multiplexer 34b such that it is then output from the OBSR 24a. Accordingly, in SegmentNormal mode, the data path flows from the MSB 32 into the OBSR tail 28, and from the OBSR tail 28 to the output multiplexer, and subsequently out of the downstream OBSRs 24 and the associated contact pin.

b. Segment Bypass Mode

Alternatively, the OBSR can be placed in the SegmentBypass mode. When the OBSR is placed in the Segment- Bypass mode data received from an upstream OBSR is shifted through the MSB 32 to the output multiplexer 34. Accordingly, data received from the previous OBSR is shifted out of the output multiplexer 34 and is input to the next OBSR in the serial chain. Therefore, sample data from a specific OBSR can be output from the contact pin by placing that OBSR in SegmentNormal mode and every other OBSR in the SegmentBypass mode. It should be noted that, minimally, only the downstream OBSRs must be placed in SegmentBypass mode. In that case, the only valid data that is conveyed to the contact pin is the data from the OBSR that was configured in SegmentNormal mode since it passes through or bypasses every other OBSR in the serial chain.

Referring again to FIG. 6, the OBSR 24 is placed into the SegmentBypass mode when a logical '0' value is stored in the LMR 30. The flip-flop 30b outputs that logical '0' value on the LMR_sflop_h signal 72 which is coupled to the selection input of multiplexer 32a via And gate 37. Because And gate 37 responsively outputs a logical '0' value, a data path is selected such that the head_serial input signal 38, (i.e. the input to the OBSR 24a) is passed to flip-flop 32. The output of flip-flop 32b is input to multiplexer 34a on signal MSB_serial_out 46. Because a logical '0' value is imposed on the selection input to multiplexer 34a, the data is passed through multiplexer 34a and multiplexer 34b and is output therefrom. In SegmentBypass mode, the data path flows from the input of the OBSR 24a, through the MSB 32 and into the output multiplexer 34 to be output from the OBSR 24. Accordingly, in SegmentBypass mode, data can pass through a given OBSR 24 for the purpose of conveying sampled data from a specified OBSR to the IC tester 18. Such an operation will be described in more detail below with respect to FIGS. 7 and 8.

IV. Functional Modes

In addition to the two operating modes described above, each OBSR 24 can be operated in one of four "functional" modes. Each OBSR 24 receives functional commands from the tester 18 via an OBSR command bus (LCB<1:0>) 56. More specifically the HCL 36 (See FIG. 4) receives those command sequences from the tester 18 and places the associated OBSR 24 in one of the following functional modes:

| MODE | LCB<1:0> |
| --- | --- |
| Sleep mode | 00 |
| ShiftLMR mode | 01 |
| ShiftData mode | 10 |
| CapData mode | 11 |

The operation of the circuit depicted by the schematic diagram of FIG. 6 will now be described. The tester 18 asserts a command associated with one of the functional modes listed above,(on the OBSR command bus 56). The OBSR command bus 56 is input to the HCL 36 which responsively configures the data path through the OBSR 24 via the value stored in the LMR 30. The HCL 36 also responsively configures the MSB 32, the output multiplexer 34, and also the clocking circuit, as will be described in more detail below.

a. Sleep Mode

When the OBSR 24a is placed into the "Sleep" mode, the OBSR 24a is turned off and will not sample data from the connected nodes of the IC. The OBSR 24a is placed in this mode when the IC 16 is in normal operation, i.e. when it is not being tested.

The test controller 18 initiates placing the OBSR 24a in the Sleep mode by asserting a logical '00' on the OBSR command bus 56. The OBSR command bus 56 is coupled to And gates 36c–36e and to inverters 36a, 36b. Based on the sleep mode command value asserted on the OBSR command bus 56, a logical '0' is received on at least one input port of each And gate 36c–36e and therefore the associated output ports each generate a logical '0'. The And gate 36e outputs a logical '0' on the selection input of multiplexer 30a. Multiplexer 30a responsively selects the feedback path 30d from the flip-flop 30b. When the feedback path is selected, no new data will be loaded into or passed through the LMR 30. Rather, on each assertion of the free running clock signal, "GCLK" 60, the output of flip-flop 30b is fed back into multiplexer 30a and again presented to flip-flop 30b, thereby latching the stored data.

Further, the output of And gate 36d is coupled to an input of And gate 36f. Accordingly, And gate 36f generates a logical '0' which is conveyed to an input of Or gate 36g. Because the other input of Or gate 36g is also a logical '0', Or gate 36g outputs a logical '0'. On the next assertion of the inverted GCLK signal 60a, the logical '0' output from Or gate 36g is clocked into flip-flop 36i and presented to And gate 36j. Responsively, And gate 36j outputs a logical '0' value, rather than an oscillating signal referred to as the conditional clock Lclk signal 44. The Lclk signal 44 is conveyed to MSB 32 and to the OBSR tail 28. Because, in this mode, the Lclk signal 44 does not oscillate, data cannot be clocked through the flip-flop 32b of MSB 32. The OBSR 24 is therefore considered in the Sleep mode since data cannot be provided to the output multiplexer 34 from the LMR 30 or from the MSB 32. Also note that in sleep mode the logic in the OBSR tail 28 are not clocked, therefore saving power.

b. ShiftLMR Mode

The second functional mode which the OBSR 24 can be placed into is the shiftLMR mode. The OBSR 24 is placed in the shiftLMR mode for the purpose of loading values into each LMR storage location 32b to place each OBSR into the SegmentBypass or SegmentNormal mode. While in the shiftLMR mode, data asserted on the head_serial_input signal 38 is shifted to the output multiplexer 34 which then conveys it to the next OBSR 24 in the serial chain. Therefore, by iteratively asserting setup data on the input port of the first OBSR 24a in the serial chain, each LMR storage location 30b in that serial chain will iteratively be loaded with the appropriate data.

In order for the test controller 18 to place the OBSR 24a in the shiftLMR mode, it asserts a logical '01' on the OBSR command bus 56. The And gate 36e responsively outputs a logical '1' to LMR 30 which selects the head_si_h signal 38 as input to multiplexer 30a. As stated above, the head_si_h signal 38 is formed by the output port of the previous OBSR 24 in the serial chain and carries data from that previous OBSR 24 into the instant OBSR 24. In the case of the shiftLMR mode, that data is setup data that is shifted through the serial chain of OBSRs in order to configure each OBSR into either the SegmentBypass or SegmentNormal modes. On each assertion of the free running GCLK signal 60, the setup data is passed from the multiplexer 30a to the flip-flop 30b and then to the output multiplexer 34.

The selection input of multiplexer 34b in output multiplexer 34 is coupled to the most significant bit (LCB<1>) of the OBSR command bus 56. Because, in the shift LMR mode, that most significant bit is a logical '0', the output of LMR 30 that was conveyed to output multiplexer 34 is selected by multiplexer 34b and is output from the OBSR 24.

The And gates 36c and 36d output logical '0' values which responsively cause And gate 36f and Or gate 36g to output logical '0' values. The logical '0' value is passed through flip-flop 36i and And gate 36j. Accordingly, the conditional clock signal Lclk 44 remains at a fixed logical '0' level and flip-flop 32b of MSB 32 is not clocked. In summary, the shiftLMR mode enables a data path from the head_serial input signal 38, through the LMR 30 and the output multiplexer 34 such that LMR setup data can be shifted through the serial chain of OBSRs.

c. ShiftDATA Mode

The third functional mode which the OBSR 24a can be placed into is the shiftDATA mode. The OBSR 24 is placed in the shiftDATA mode for shifting sampled data from the OBSR sampling cells 40 into the output multiplexer 34 and out of the OBSR 24. Also, the shiftDATA mode is used for initializing the MSB and the OBSR tails as will be described below. In order for the test controller 18 to place the OBSR 24a in the shiftDATA mode, it asserts a logical '10' on the OBSR command bus 56. The And gate 36e responsively outputs a logical '0' to LMR 30 which selects the feedback path 30d as input and latches the data previously stored in the LMR storage location 30b.

The And gate 36d also outputs a logical '0' value which is conveyed through And gate 37 to the selection input of multiplexer 32a. The logical '0' value selects the head_serial_input signal 38 as input to multiplexer 32a. As stated above, the head_serial_input 38 is formed by the output port of the previous OBSR 24 in the serial chain and carries data from that previous OBSR 24 into the instant OBSR 24. In the shiftDATA mode, that data is shifted through the serial chain of OBSRs in order to push sampled data out of the OBSR tail storage cells 40 and subsequently out of the output multiplexer 34. On each assertion of the Lclk signal 44, the data on the head_si_h signal 38 is passed from the multiplexer 32a to the flip-flop 32b and then to the input of the OBSR tail 28 via bus 46. Referring also to FIG. 5, the multiplexer 50 of the first OBSR tail sampling cell 40a receives data used to push the sampled data out of each OBSR 24. The capture_h signal 42 is coupled to the output of And gate 36d, which outputs a logical '0' value. When the capture_h signal 42 is a logical '0', multiplexer 50, in the OBSR tail 28, conveys the incoming data from bus 64 to the input port of flip-flop 52. On the next assertion of the Lclk signal 44, flip-flop 52 outputs the stored sample data and latches the incoming data. Therefore, the incoming data effectively pushes the data out of the OBSR tail, i.e. out of the OBSR sampling cells 40. The use of such an operation will be described in more detail below with respect to the IC testing procedure.

When the sample data is pushed out of the first OBSR sampling cell 40a, it is pushed into the next OBSR sampling cell 40b in the OBSR tail 28. At the same time, the sample data stored by the last OBSR sampling cell 42x in the serial chain is output therefrom. That data is conveyed via the feedback_h signal 68 to multiplexer 34a of the output multiplexer 34 and then out of the OBSR.

d. CapDATA Mode

The last functional mode which the OBSR 24a can be placed into is the "capDATA" mode. The OBSR 24 is placed in the capDATA mode to force the OBSR sampling cells to sample the value of the connected IC node. In order for the test controller 18 to place the OBSR 24a in the capDATA mode, it asserts a logical '11' on the OBSR command bus 56. The And gate 16e responsively outputs a logical '0' to LMR 30 which responsively inputs the feedback path 30d and latches the data previously stored in the LMR 30.

The And gate 36d outputs a logical '1' value which is conveyed to the OBSR tail 28 via the capture_h signal 42. The capture_h signal 42 is coupled to the selection input of multiplexer 50 of the OBSR tail 28 (FIG. 5). Because the capture_h signal 42 is asserted, the multiplexer outputs the same value as the output of the exclusive-or gate 48 to the flip-flop 52. The flip-flop 52 will latch the sampled data on the every assertion of the Lclk signal 44.

The logical '1' value output from And gate 36d is also presented to an input port of And gate 37. Accordingly, And gate 37 will output the value latched into LMR 30.

The And gates 36c and 36d output a logical '0' and a logical '1' value respectively. Those values cause multiplexer 36i to output the same values that are on the signal_valid_h signal 70. Therefore, And gate 36j outputs the value of the signal_valid_h signal 70 onto signal Lclk_h 44 each time that the GCLK signal 60 is asserted. When the OBSR 24 is in the capDATA mode, the OBSR tail 28 will sample the connected nodes on each assertion of the GCLK signal 60 for which the signal_valid_h signal 70 is asserted, i.e. because those conditions generate the assertion of the Lclk signal 44. The signal_valid_h signal 70 is typically connected to a node in the circuit portions 26 (see FIG. 3) that indicates whether the nodes being sampled have been initialized and are valid.

Accordingly, each of the two operating modes and four functional modes have been described independently. The operation of the OBSRs 24 will now be described with respect to execution of an IC test.

V. Operation of the OBSRs

Figure 7:
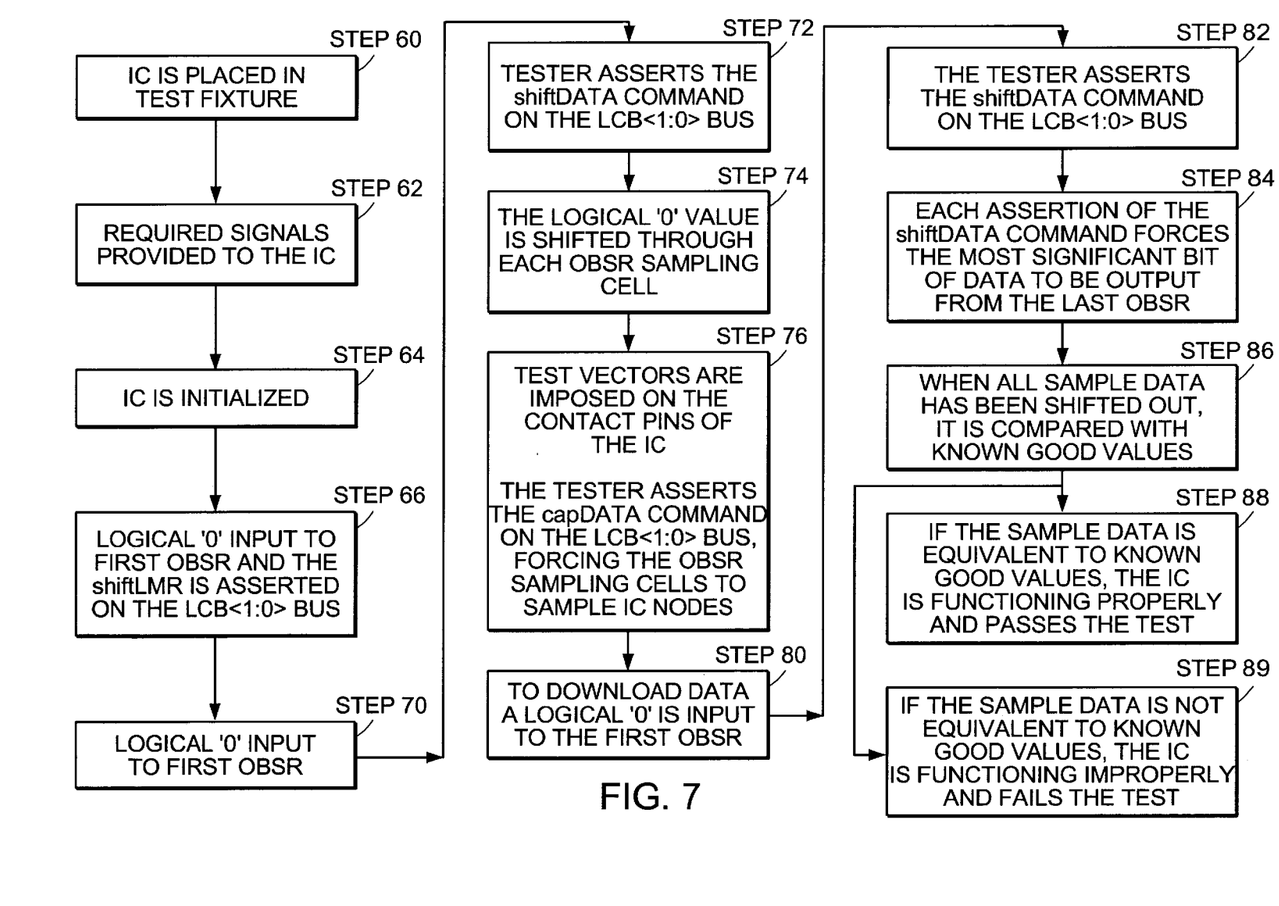
FIG. 7 is a flow diagram depicting Execution of an integrated circuit test on an integrated circuit such as depicted in FIG. 1.

Referring now to FIG. 7, a flow diagram depicts the operation of the OBSRs 24 during an IC test. First the IC is placed into the test fixture 20 (Step 60) (See FIG. 2). The test fixture 20 includes conductive pins which make electrical connection with each external contact pin of the IC. The required signals, such as power and clocks, are provided to the IC (Step 62). The IC is then initialized by execution of the hardware reset procedure which typically includes asserting a specified voltage on a reset pin of the device for a specified period of time (Step 64). After the IC has been initialized, the serial chain of OBSRs is initialized.

To set up the OBSRs, a logical '1' value is loaded into the memory storage location 30b of each LMR 30 of each OBSR 24 in the serial chain. To load those values into each LMR 30, the tester 18 (or an on-chip controller) asserts the shiftLMR command ('01') on the LCB<1:0> bus and places a logical '1' on the input port of the first OBSR 42a in the serial chain 56 for a number of assertions of the GCLK signal 60 that is equivalent to the total number of LMR storage locations 54 in the serial chain (Step 66). When each LMR storage location 30b stores a logical '1', the corresponding OBSR 24 is placed into the SegmentNormal operating mode.

The next step in the initialization of the OBSRs involves placing each data storage location in each OBSR tail 28 and MSB 32 into a known state. That is typically done by storing logical '0' values in each storage location. Accordingly, the IC tester 18 places a logical '0' value on the input port of the first OBSR 24a in the serial chain (Step 70). The tester subsequently asserts the shiftDATA command ('10') on the LCB<1:0> bus 56 for a number of assertions of the Lclk signal 44 that is equivalent to the total number of storage locations in each OBSR tail 28 and MSB 32 in the serial chain (Step 72). Each time the Lclk signal 44 is asserted while the shiftDATA command is asserted on the LCB<1:0> bus 56, the storage locations in each MSB 32 and OBSR tail 28 shift by one bit. The initial shift causes the logical '0' value to be drawn into the MSB 32 of the first OBSR 42a in the serial chain. Subsequently the logical '0' value is shifted through each successive OBSR sampling cell 40 of that OBSR 24a and then out to the next OBSR 24 in the serial chain via the output multiplexer 34 (Step 74). When each MSB 32 and OBSR tail 28 storage location contains a logical '0', the OBSRs 24 are considered initialized.

When the IC and the OBSRs 24 are initialized, the IC tester begins asserting the capDATA command on the LCB<1:0> bus 56 and simultaneously imposes test vectors on the contact pins 14 (Step 76). In response to each assertion of the capDATA command, the OBSR sampling cells are forced to sample the IC nodes to which they are connected. The sampled data is recursively compressed in the flip-flop 52 of the associated OBSR sampling cell 40. Alternatively, if the capDATA command is asserted for only a single cycle of the Lclk signal 44, the sampled data is not compressed but rather is stored in the flip-flop 52.

When all the test vectors have been imposed on the IC, the contents of the OBSR sampling cells are serially downloaded from each OBSR in the serial chain so that it can be compared with known good values. To download the data stored in the OBSRs, the IC tester places a logical '0' value on the input port of the first OBSR 24a in the serial chain (Step 80). The tester 18 subsequently asserts the shiftDATA command on the LCB<1:0> bus 56 for a number of assertions of the Lclk signal 44 equivalent to the total number of storage locations in each OBSR tail 28 and MSB 32 in the serial chain (Step 82). Each time the Lclk signal 44 asserts while the shiftDATA command is asserted on the LCB<1:0> bus 56, each MSB 32 and OBSR tail 28 serially shifts out one bit of data. That shift causes the logical '0' value to be drawn into the first OBSR 24a in the serial chain, and the most significant bit of the stored data to be output from the last OBSR 42x in the serial chain. The logical '0' value is shifted through each successive OBSR sampling cell 40 of that OBSR 42a and then out to the next OBSR 24 in the serial chain, forcing one bit of stored data to be shifted out of the last OBSR in the serial chain during each shift (Step 84). When all of the sampled data stored in the storage locations of each MSB 32 and OBSR tail 28 is shifted out of the last OBSR 42x in the serial chain, it is compared with known good values stored in a memory 22 coupled to the tester 18 (Step 86).

If the data shifted out of the OBSRs is equivalent to the known good values, then the IC is functioning properly and passes the test (Step 88). However, if a mismatch between the two sets of data is identified, the IC has operated in a faulty manner (Step 89).

In such a situation, it is often desired to locate the origin of the error to understand and correct it. That operation is referred to as "debugging". Using the OBSR of the present invention, such debugging becomes a relatively simple operation of identifying the OBSR that sampled the faulty data, i.e. isolating the fault to a limited number of nodes, and a limited number of test vectors.

Figure 8:
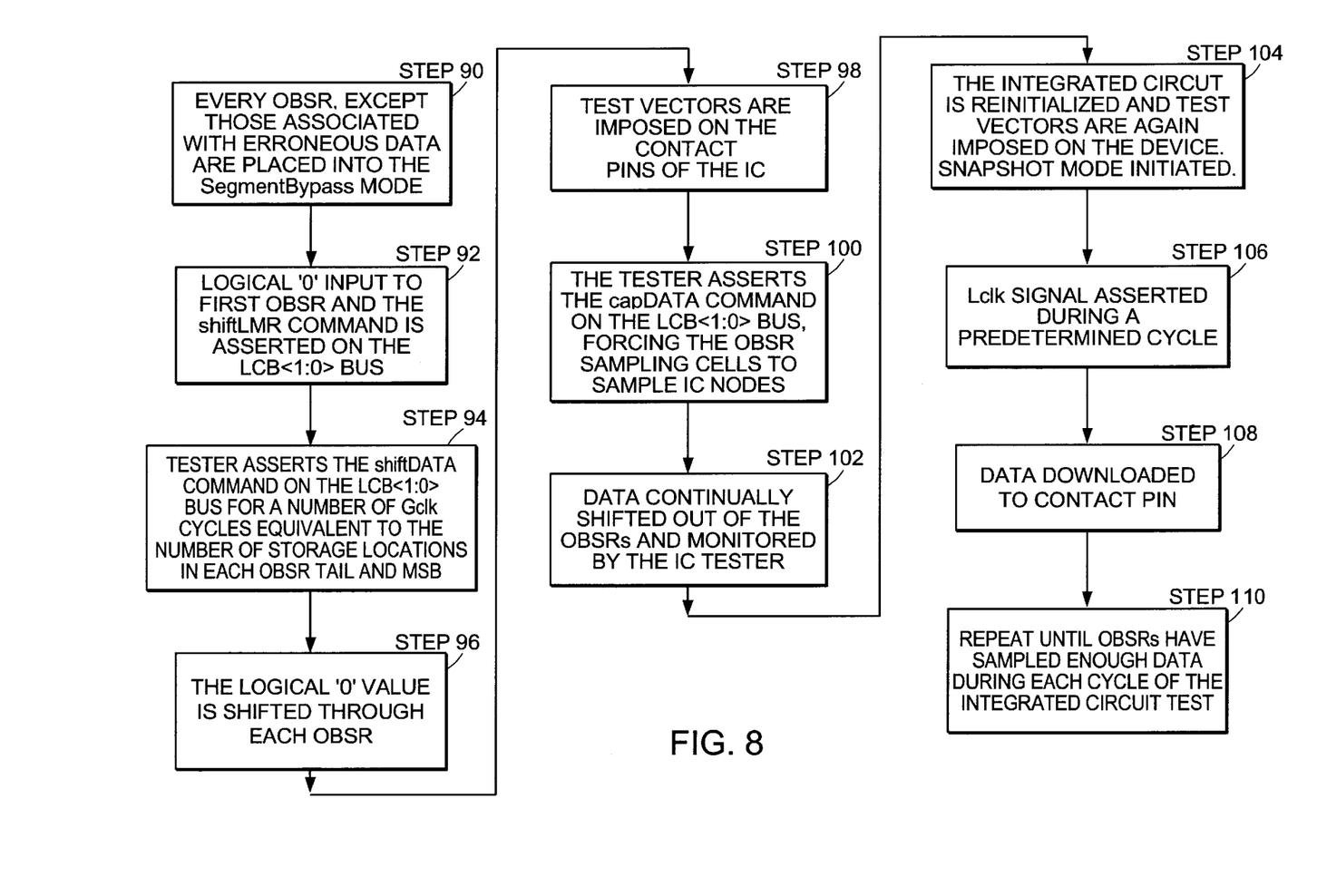
FIG. 8 is a flow diagram depicting execution of a debugging test on an integrated circuit such as depicted in FIG. 1.

Referring now to FIG. 8, a flow diagram depicts the operation of such a debugging test. It should be noted that the debugging test operates on one OBSR at a time and therefore the test must be repeated for each failing OBSR. When the OBSRs are being set up and initialized, every OBSR in the serial chain, except a selected one of those that are associated with the erroneous data, are placed in the SegmentBypass mode. The OBSR associated with the failing condition is placed in the SegmentNormal mode such that it can sample the connected nodes of the IC 16 and transfer that data to the associated contact pin via the downstream OBSRs which are operating in segment bypass mode (Step 90).

In order to initialize the OBSRs 24 in that manner, the data to be serially loaded into each LMR 30 of each OBSR 24 in the serial chain, is arranged such that only the storage location of the LMRs 30 associated with the erroneous data receive logical '1' values and the remainder receive logical '0' values. For example, consider that the failing OBSR 42 is the tenth OBSR from the beginning of a serial chain of ninety OBSRs (where the ninetieth OBSR is closest to the contact pin). The tester 18 will input a logical '0' value to the first OBSR 42a and assert the shiftLMR command on the LCB<1:0> bus 56 for eighty cycles of the GCLK signal 60 (such that after initialization the eleventh through the ninetieth OBSRs will be in SegmentBypass mode). Next, the IC tester inputs a logical '1' to the first OBSR 42a and asserts the shiftLMR command on the LCB<1:0> bus for one cycle of the GCLK signal 60 (such that after initialization the tenth OBSR will be in SegmentNormal mode). Finally, the IC tester 18 inputs a logical '0' value to the first OBSR 42a and asserts the shiftLMR command on the LCB<1:0> bus for nine more cycles of the GCLK signal 60 (such that after initialization the ninth through first OBSR will be in segment bypass mode). Accordingly, when all the values have been shifted into the OBSRs, the first value to be input to the serial chain of OBSRs will have reached the last, i.e. ninetieth OBSR.

As performed during the initial IC test, each storage location in each OBSR tail 28 and MSB 32 is placed into a known state, typically by storing logical '0' values therein. As stated above, the tester 18 places a logical '0' value on the input port of the first OBSR 24a in the serial chain (Step 92). The tester 18 subsequently asserts the shiftDATA command on the LCB<1:0> bus 56 for a number of cycles of the GCLK signal 60 equivalent to the total number of storage locations in each OBSR tail 28 and MSB 32 in the serial chain (Step 94). Each time the shiftDATA command is asserted on the LCB<1:0> bus 56, the storage locations in each MSB 32 and OBSR tail 28 shift by one bit. The initial shift causes the logical '0' value to be drawn into the first OBSR 24a in the serial chain. Subsequently the logical '0' value is shifted through each successive OBSR sampling cell 40 of that OBSR 24a and then out to the next OBSR 24 in the serial chain via the output multiplexer 34 (Step 96). When each storage location MSB 32 and OBSR tail 28 storage location contains a logical '0', the OBSRs 24 are initialized and the test vectors can be applied to the contact pins of the IC 16 (Step 98).

In order to command the OBSR, that is configured in SegmentNormal mode, to begin sampling data, the IC tester asserts the capDATA command on the LCB<1:0> bus 56 (Step 100). The OBSR sampling cells 40 of that OBSR 24 sample the nodes to which they are connected in response to each assertion of the Lclk signal 44 while the capDATA command is asserted. Therefore, the same test vectors as were used during the initial test are imposed upon the IC 16. The sampled data is continually compressed, shifted out of the OBSRs 24 and monitored by the IC tester 18 (Step 102). In this manner, the IC tester identifies the cycle in which the test failed within a small deterministic number of cycles, i.e. the number of cycles that it takes to shift the data through each of the downstream OBSRs that are in SegmentBypass mode and onto the contact pin.

Subsequently, the IC is re-initialized and the test vectors are again imposed upon the IC 16 (Step 104). For this portion of the test the snapshot mode will be used. The Lclk signal 44 is asserted for a single predetermined cycle which is prior to the failing cycle determined above (Step 106). After the test vectors are imposed on the IC, the data sampled during the predetermined cycle is downloaded to the contact pin (Step 108). That data is stored in the IC tester and the same test vectors are again imposed on the IC 16. Each time the vectors are re-imposed on the IC 16, the Lclk signal 44 is asserted during a cycle which immediately follows the predetermined cycle from the previous running of the test. Again the sampled data is shifted out of the OBSRs 24 and stored in the memory location coupled to the IC tester 18.

This process is repeated until the OBSR sampling cells 40 have sampled data during each cycle of the test (Step 110). Accordingly, the accumulated data provides a cycle by cycle profile of the activity on the circuits coupled to the OBSR sampling cells only. That data is less voluminous than it would otherwise be if selected OBSRs 24 could not be placed into the Segment Bypass mode. Also, the data is less voluminous because the failure is isolated to a deterministic number of cycles. The snapshot mode is used only for those cycles rather than for the entire test.

An alternative embodiment

Figure 9:
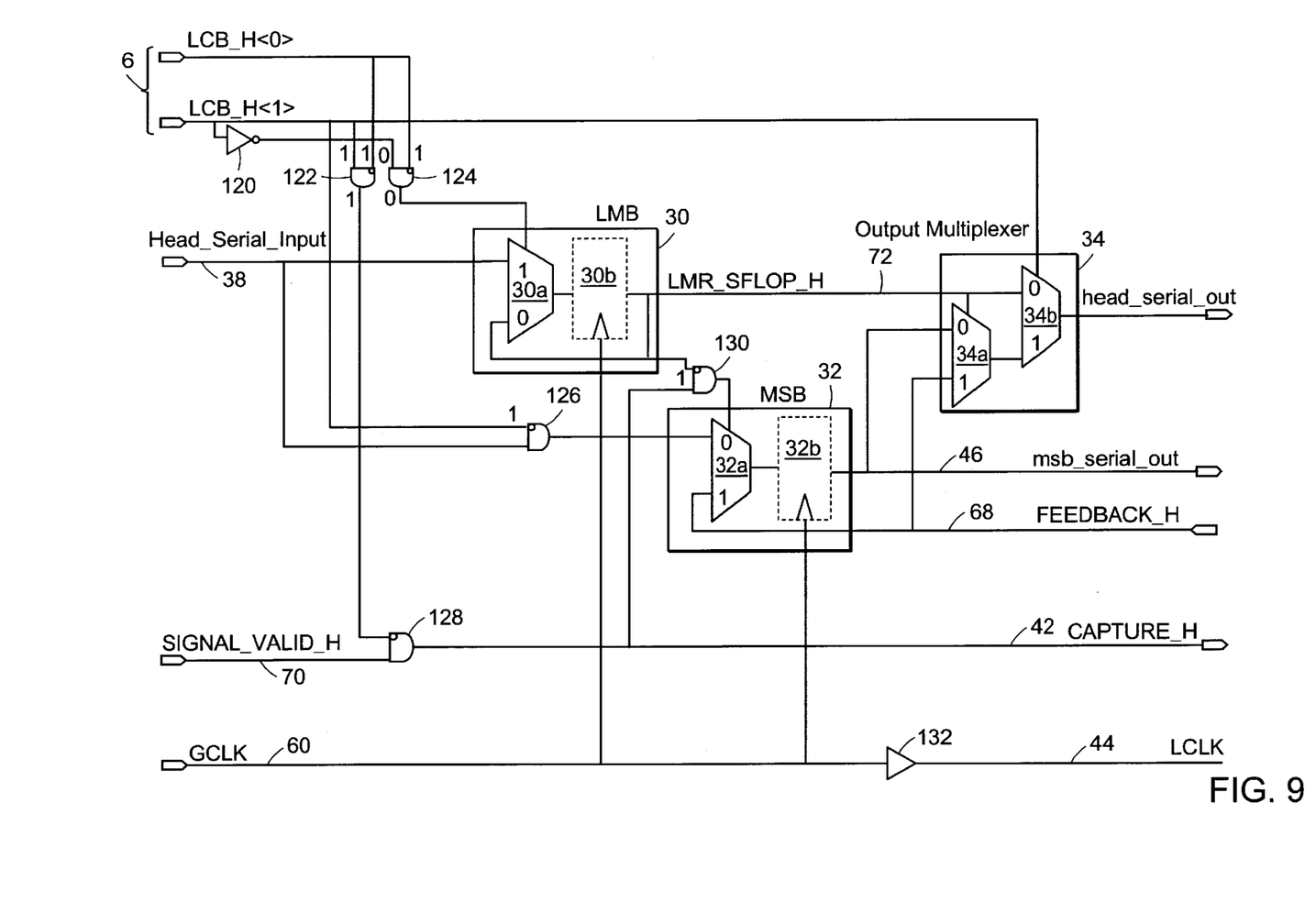
FIG. 9 depicts a further embodiment of the present invention.

Referring now to FIG. 9, an alternative embodiment of the OBSR head, embodied in the present invention, is depicted. The instant embodiment depicts the free running GCLK signal 60 unconditionally generating the Lclk signal 44 via a buffer device 132. The HCL 36 is modified to support such a free running Lclk implementation as described below. The free running Lclk signal 44, is provided to the OBSR tail 28. The OBSR sampling cells will sample the associated integrated circuit nodes each time the Lclk signal 44 is asserted when the capture_h signal 42 is also asserted. Accordingly, the sampling operation of the OBSR is controlled by asserting and de-asserting the capture_h signal 42. Except for that difference, the embodiment depicted in FIG. 9 operates in the same functional and operational modes as the embodiment depicted in FIG. 6. The operation of those modes will now be described.

The test controller 18 initiates placing the OBSR 24a in the Sleep mode by asserting a logical '00' on the OBSR command bus 56 which is coupled to And gates 122–128 and to inverter 120. Based on that value, a logical '0' is received on at least one input port of each And gate 122–128 and therefore their associated output ports each generate a logical '0'. The And gate 124 outputs a logical '0' on the selection input of multiplexer 30a. Multiplexer 30a responsively selects the feedback path 30d from the flip-flop 30b. When the feedback path is selected, no new data will be loaded into or passed through the LMR 30. Rather, on each assertion of the free running clock signal, "GCLK" 60, the output of flip-flop 30b is fed back into multiplexer 30a and again presented to flip-flop 30b, thereby latching the stored data.

Further, the output of And gate 122 is coupled to an input of And gate 128. Accordingly, And gate 128 generates a logical '0' which is conveyed to the OBSR tail 28 via the capture_h signal 42, thereby disabling the OBSR sampling cells from sampling the associated IC nodes.

The second functional mode which the OBSR 24 can be placed into is the shiftLMR mode. In order for the test controller 18 to place the OBSR 24a in the shiftLMR mode, it asserts a logical '01' on the OBSR command bus 56. The And gate 124 responsively outputs a logical '1' to LMR 30 which selects the head_si_h signal 38 as input to multiplexer 30a. As stated above, the head_si_h signal 38 is formed by the output port of the previous OBSR 24 in the serial chain and carries data from that previous OBSR 24 into the instant OBSR 24. In the case of the shiftLMR mode, that data is setup data that is shifted through the serial chain of OBSRs in order to configure each OBSR into either the SegmentBypass or SegmentNormal modes. On each assertion of the free running GCLK signal 60, the setup data is passed from the multiplexer 30a to the flip-flop 30b and then to the output multiplexer 34.

The selection input of multiplexer 34b in output multiplexer 34 is coupled to the most significant bit of the OBSR command bus 56. Because, in the shift LMR mode, that most significant bit is a logical '0', the output of LMR 30 that was conveyed to output multiplexer 34 is selected by multiplexer 34b and is output from the OBSR 24.

The output of And gate 122 is coupled to an input of And gate 128. Accordingly, And gate 128 generates a logical '0' which is conveyed to the OBSR tail 28 via the capture_h signal 42.

The third functional mode which the OBSR 24a can be placed into is the shiftDATA mode. In order for the test controller 18 to place the OBSR 24a in the shiftDATA mode, it asserts a logical '10' on the OBSR command bus 56. The And gate 124 responsively outputs a logical '0' to LMR 30 which selects the feedback path 30d as input and latches the data previously stored in the LMR storage location 30b.

The And gate 122 also outputs a logical '0' value which is conveyed through And gates 128 and 130 to the selection input of multiplexer 32a. The logical '0' value selects the head_serial_input signal 38 as input to multiplexer 32a. As stated above, the head_serial_input 38 is formed by the output port of the previous OBSR 24 in the serial chain and carries data from that previous OBSR 24 into the instant OBSR 24. In the shiftDATA mode, that data is shifted through the serial chain of OBSRs in order to push sampled data out of the OBSR tail storage cells 40 and subsequently out of the output multiplexer 34. On each assertion of the Lclk signal 44, the data on the head_si_h signal 38 is passed from the multiplexer 32a to the flip-flop 32b and then to the input of the OBSR tail 28 via the MSB_serial_out signal 46. The capture_h signal 42 is coupled to the output of And gate 128, which outputs a logical '0' value. When the capture h signal 42 is a logical '0', multiplexer 50, in the OBSR tail 28, conveys the incoming data from bus 64 to the input port of flip-flop 52. On the next assertion of the Lclk signal 44, flip-flop 52 outputs the stored sample data and latches the incoming data. Therefore, the incoming data effectively pushes the sample data out of the OBSR sampling cell 40. The use of such an operation will be described in more detail below with respect to the IC testing procedure.

When the sample data is pushed out of the first OBSR sampling cell 40a, it is pushed into the next OBSR sampling cell 40b in the OBSR tail 28 (See FIG. 5). At the same time, the sample data stored by the last OBSR sampling cell 42x in the serial chain is output therefrom. That data is conveyed via the feedback_h signal 68 to multiplexer 34a of the output multiplexer 34 and then out of the OBSR.

The last functional node which the OBSR 24a can be placed into is the "capDATA" mode. In order for the test controller 18 to place the OBSR 24a in the capDATA mode, it asserts a logical '11' on the OBSR command bus 56. The And gate 124 responsively outputs a logical '0' to LMR 30 which responsively inputs the feedback path 30d and latches the data previously stored in the LMR 30.

The And gate 122 outputs a logical '1' value which is conveyed to the OBSR tail 28 via the capture_h signal 42. The capture_h signal 42 is coupled to the selection input of multiplexer 50 of the OBSR tail 28 (FIG. 5). Because the capture_h signal 42 is asserted, the multiplexer outputs the same value as the output of the exclusive-or gate 48 to the flip-flop 52. The flip-flop 52 will latch the sampled data on the next assertion of the Lclk signal 44.

The logical '1' value output from And gate 122 is also presented to an input port of And gate 130 when the signal-valid signal 70 is asserted. Accordingly, And gate 130 will output the value latched into LMR 30.

It should be noted that in a further embodiment, the output of a serial chain of OBSRs (each embodying the present invention) can be coupled to a conductive pad rather than, or in addition to, an external contact pin. The conductive pad is engaged by an electronic probe referred to as a wafer probe when the device is being tested. The wafer probe conveys the output of the serial chain of OBSRs to the tester for analysis, as described above.

Having described a preferred embodiment of the invention, it will now become apparent to one of ordinary skill in the art that other embodiments incorporating its concepts may be used. It is felt, therefore, that this embodiment should not be limited to the disclosed embodiment, but rather should be limited only by the spirit and scope of the appended claims.

What is claimed is:

1. An observability register, of a plurality of observability registers connected in a serial chain manner, for generating sample data by sampling nodes of an electrical circuit, said observability register comprising:

a tail portion for sampling said nodes of said electrical circuit in a manner such that the tail portion operates in a non-power consuming sleep mode during non-testing of the electrical circuit, said sleep mode eliminating power consumption outside of testing of the electrical circuit and wherein said nodes of said electrical circuit are sampled after an associated signal indicates that said nodes have been initialized;

a serial input port for receiving input data to be operated on by the observability register;

a serial output port for outputting output data operated on by the observability register;

a configurable data path having a first configuration for transferring said sample data from said serial input port to said serial output port by bypassing said tail portion during non-testing, and said configurable data path having a second configuration for transferring said sample data from said serial input port to said serial output port by shifting said sample data through said tail portion during testing; and a control logic for configuring said configurable data path in said first configuration or in said second configuration.

2. The observability register of claim 1 wherein each configurable data path in a first selected group of said plurality of observability registers are configured in said first configuration and each configurable data path of a second selected group of said plurality of observability registers are configured in said second configuration such that said sample data, generated by said second selected group, is transferred through each of said plurality of observability registers to a serial output port of a last one of said plurality of observability registers.

3. The observability register of claim 1, wherein said control logic includes:

a memory location for storing a first predetermined value or a second predetermined value, said first value associated with said first configuration and said second predetermined value associated with said second configuration.

4. The observability register of claim 3 wherein said configurable data path is configured in said first configuration in response to said first predetermined value being stored in said memory location.

5. The observability register of claim 4 wherein said tail portion includes a plurality of sampling units each coupled to one of said nodes for sampling a voltage level at said coupled node and for storing a representation of said voltage level, said plurality of sampling units connected in a serial chain manner such that when a data element is shifted into a first sampling unit in the serial chain an equivalent amount of data is shifted out of a last sampling unit in said serial chain.

6. The observability register of claim 5 wherein said configurable data path passes said input data from said serial input port into said first sampling unit such that sample data stored in the plurality of sampling units is shifted out of said last sampling unit and is passed to said serial output port, in response to said second predetermined value being stored in said memory location.

7. The observability register of claim 5 wherein said representation of said voltage level is a compressed representation comprising an exclusive-or function of said voltage level and a value provided by an upstream observability register.

8. A method for testing nodes of an integrated circuit that are functionally distant from a contact pin of said integrated circuit, using a plurality of serially connected observability registers, including the steps of:

imposing a plurality of test vectors on said integrated circuit and sampling said nodes, by said observability registers, at predetermined cycles when said integrated circuit is responding to said test vectors;

identifying ones of said plurality of test vectors that cause a failing condition to occur in said integrated circuit by analyzing said samples taken by said observability registers and identifying ones of said plurality of observability registers that are associated with said failing condition;

configuring said identified ones of said plurality of observability registers to sample said nodes to which they are coupled, in response to a capture signal, and configuring the remaining observability registers to transfer data from a serial input port to a serial output port by bypassing an associated tail portion in response to said capture signal, said capture signal asserted by a test controller in a manner such that the tail portion consumes power only during testing of the integrated circuit and is in a non-power consuming sleep mode during non-testing of the integrated circuit;

re-imposing said plurality of test vectors on said integrated circuit for a predetermined number of times;

asserting said capture signal at preselected times during each of said re-impositions of said identified ones of said plurality of test vectors that cause a failing condition to occur, each said assertion of said capture signal associated with a voltage sample value.

9. The method of claim 8 further including the step of:

outputting representations of said voltage sample values after each of said assertions of said capture signal during each of said impositions of said identified ones of said plurality of test vectors.

10. The method of claim 9, further including the step of:

comparing said representations of said voltage sample values to known-good sample values to determine a failure time when said failing condition occurred; and analyzing said representations of said voltage sample values to determine a cause of said failing condition.

11. The method of claim 10 wherein said preselected times are each associated with a different one of a plurality of clock cycles preceding said failure time.

12. The method of claim 11 wherein said step of outputting said representations of said voltage sample values includes the steps of:

inputting a plurality of data values to a serial input port of a first one of said serially connected observability registers, said first observability register having said serial input port coupled to said test controller; and shifting a number of said representations of said voltage sample values out of a serial output port of a last one of said serially connected observability registers in response to said inputting step, said last observability register having said serial output port coupled to said test controller, said number being equivalent to a quantity of said plurality of data values input to said serial input port of said first observability register.

13. A system for testing an integrated circuit, comprising:

a test fixture having one or more conductive pins for electrically coupling with corresponding contact pins of said integrated circuit;

a tester unit, coupled to said conductive pins of said test fixture, for imposing test vectors on said contact pins of said integrated circuit;

one or more observability registers, each coupled to one or more nodes of said integrated circuit, each of said observability registers including a respective tail portion for sampling said nodes of said electrical circuit during testing, wherein a configurable data path having a first configuration for transferring a plurality of sample data from a serial input port to a serial output port by bypassing said tail portion during non-testing, and a second configuration for transferring said sample data from said serial input port to said serial output port by shifting said sample data through said tail portion during testing, said tail portion consuming power only during testing of the integrated circuit and being in a non-power consuming sleep mode during non-testing the integrated circuit.

14. The system claim 13 wherein each of said observability registers further include:

a memory location for storing a first predetermined value or a second predetermined value, said first value associated with said first configuration and said second predetermined value associated with said second configuration.

15. The system of claim 14 wherein said configurable data path is configured in said first configuration in response to said first predetermined value being stored in said memory location.

16. The system of claim 15 wherein said tail portion includes a plurality of sampling units each coupled to one of said nodes for sampling a voltage level at said coupled node and for storing a representation of said voltage level, said plurality of sampling units connected in a serial chain manner such that when a data element is shifted into a first sampling unit in the serial chain an equivalent amount of data is shifted out of a last sampling unit in said serial chain.

* * * * *